US006885154B2

United States Patent
Uchida et al.

(10) Patent No.: US 6,885,154 B2
(45) Date of Patent: Apr. 26, 2005

(54) DISCHARGE PLASMA PROCESSING SYSTEM

(75) Inventors: Taijiro Uchida, Fujisawa (JP); Toshijyu Kunibe, Chigasaki (JP)

(73) Assignee: ULVAC, Inc., Chigasaki (JP)

(*) Notice: Subject to any disclaimer, the term of this patent is extended or adjusted under 35 U.S.C. 154(b) by 0 days.

(21) Appl. No.: 10/457,519

(22) Filed: Jun. 10, 2003

(65) Prior Publication Data

US 2003/0230985 A1 Dec. 18, 2003

(30) Foreign Application Priority Data

Jun. 12, 2002 (JP) .................................. 2002-172015
Jun. 12, 2002 (JP) .................................. 2002-172017

(51) Int. Cl.$^7$ ................................................ H01J 7/24
(52) U.S. Cl. ........................... 315/111.71; 315/111.41; 118/723 E; 118/723 I; 204/298.22; 204/298.2
(58) Field of Search ................... 315/111.71, 111.41, 315/111.21; 118/723; 204/298.22, 298.2, 298.18, 298.17

(56) References Cited

U.S. PATENT DOCUMENTS

| 5,733,405 A | * | 3/1998 | Taki et al. | ............. 156/345.46 |
| 6,422,172 B1 | * | 7/2002 | Tanaka et al. | ........... 118/723 R |
| 2002/0170678 A1 | * | 11/2002 | Hayashi et al. | ......... 156/345.48 |

FOREIGN PATENT DOCUMENTS

| JP | 2705897 | 9/1997 |
| JP | 3177573 | 4/2001 |

* cited by examiner

*Primary Examiner*—Tuyet Thi Vo
(74) *Attorney, Agent, or Firm*—Stites & Harbison PLLC; Ross F. Hunt, Jr.

(57) ABSTRACT

The present invention provides a magnetic neutral line plasma discharge processing system that makes it no longer necessary to use an insulator wall in the vacuum chamber and metal such as stainless steel may alternatively be used, while maintaining the features including both time/space and space controllability relative to the size and the location of low pressure, low temperature and high density plasma to be generated. Thus, the cost of the system can be reduced remarkably. As a result, the scope of application of discharge plasma systems can be broadened. A magnetic neutral line plasma discharge processing system according to the invention comprises a magnetic field generating means for generating a magnetic neutral line formed by a succession of zero magnetic field positions existing continuously in the vacuum chamber and corresponding to the shape and the size of the object of processing and an electric field generating means for generating discharge plasma in a space containing the magnetic neutral line by applying a radio frequency electric field to the magnetic neutral line generated in the vacuum chamber by said magnetic field generating means at an inclined angle, said inclined angle possibly being rectangle.

21 Claims, 4 Drawing Sheets

DISCHARGE PLASMA PROCESSING SYSTEM

BACKGROUND OF THE INVENTION

1. Field of the Invention

The present invention relates to a discharge plasma processing system for performing a processing operation such as etching, sputtering, coating and CVD on an object such as a substrate or a target by utilizing discharged plasma.

2. Related Background Art

Magnetic neutral line discharge or loop discharge plasma systems have been proposed in Japanese Patents Nos. 2705897 and 3177573. The effectiveness of such systems has been verified and their industrial merits have been acknowledged. The magnetic neutral line discharge or loop discharge (also referred to as NLD for abbreviation) plasma has two major features that other plasma systems do not have.

One of the features is that it provides time/space controllability relative to the size and the location of plasma to be generated. In other words, both the size and the location of required plasma can be changed in terms of both time and space. This is because a magnetic neutral line in a vacuum chamber can be formed by outside control without difficulty and plasma can be generated along the profile of the magnetic neutral line. This type of freedom is not found in any other systems.

The other feature is that the NLD plasma does not contain higher temperature component which is not necessary for surface treatments and a higher density plasma can be produced under a lower gas pressure supply, comparing with any other plasma production method.

These features come from so-called a chaotic phenomenon of electrons generated and located around a magnetic neutral line due to meandering motions crossing the neutral line when an rf electric field is applied to the neutral line.

Electrons to be generated around the neutral line are well heated and thermalized so chaotically that result in rise up of electron density itself rather than increase of temperature under ordinary rf electric field application Higher density electrons of lower temperature make easier transfer of electron energy to neutrals and ions so that a lower temperature and higher density plasma can be generated under lower pressure gas supply. This leads us such plasma is useful for damage-less and high through put operation of surface processing. Actually, the NLD system: magnetic neutral line discharge plasma processing systems are performing remarkably well in the field of ultra-micro processing that increasingly requires high processing precision such as glass processing for micro-lenses and optical wave-guides and etching of low dielectric materials.

FIG. 1 of the accompanying drawings is a conceptual illustration of a magnetic neutral line discharge plasma processing system manufactured for the purpose of processing the surface of a disk-shaped substrate. Such systems have been manufactured to date. Referring to FIG. 1, the illustrated system comprises a cylindrical vacuum chamber A, and three coils including an upper coil B, a middle coil C and a lower coil D that are arranged coaxially outside the vacuum chamber A. A circular magnetic neutral line E is produced in the cylindrical vacuum chamber A by regulating currents made to flow to the three coils B, C and D. Plasma is generated in the form of a doughnut having a core of circular magnetic neutral line E by an induction field directed to the azimuth that is generated by an excitation current flowing to RF coil G wound outside an insulating cylindrical vacuum wall F typically made of ceramic. For this process, the diameter and the vertical position of the doughnut-like plasma can be freely controlled by the combination of the electric currents made to flow to the coils B, C and D even during the processing operation.

As pointed out above, high density and low temperature plasma is generated by using low pressure gas in a magnetic neutral line discharge plasma processing system and this feature is very advantageous when it is exploited for various processing operations. Thus, there is a strong demand for improved magnetic neutral line discharge plasma processing systems that have characteristic features that are not found in any other type systems.

While the magnetic neutral line discharge plasma processing systems perform remarkably well as described above, they still have room for improvement from the viewpoint of ease of handling and reduction of the period necessary for servicing and adjustment. Additionally, the system itself can be expensive particularly when costly ceramic is used for the purpose of acquiring desired properties including toughness and resistance against vacuum. Therefore, development of less costly novel materials that will be commercially available has been eagerly waited for.

In the case of currently available circular magnetic neutral line discharge plasma, theoretically a cylindrical ceramic container has to be used as lateral wall of a vacuum chamber and one-turn coil for a radio frequency (RF) has to be wound around the outer periphery of the container in order to apply an electric field along a circular magnetic neutral line. However, a thick-walled cylindrical ceramic container having a diameter of tens of several centimeters is expensive and, if the inner wall surface that is located at the vacuum side is made very smooth, some measures need to be taken to eliminate or prevent adsorption attributable to affinity for gas of a special type. As pointed out above, the use of costly ceramic as wall material for the purpose of acquiring desired properties including toughness and resistance against vacuum raises the cost of the system itself particularly when the system is large. This is also a problem to be dissolved for processing operations using ICP, type processing systems.

Therefore, the present invention needs to dissolve the above identified problems.

Additionally, conventional three magnetic field coil type processing systems as illustrated in FIG. 1 are required to be lightweight and energy saving and, at the same time, have a reduced number of components that is to be achieved by reducing the number of coils as many as possible from the viewpoint of arrangement of other components for plasma processing.

SUMMARY OF THE INVENTION

In view of the above identified circumstances, it is therefore a first object of the present invention to provide a magnetic neutral line discharge plasma processing system that is realized by employing a completely novel magnetic neutral line discharge system in which magnetic neutral line discharge plasma is generated in a peripheral space that contains in the inside a magnetic neutral line by applying a RF electric field to the magnetic neutral line at an angle inclined to the plane of the magnetic neutral line, the angle including an angle which may be rectangle.

A second object of the present invention is to provide a magnetic neutral line discharge plasma processing system that is lightweight and has a minimal number of components that is achieved by improving the configuration of the magnetic field generating means and reducing the longitudinal dimension of the system and particularly that of the vacuum chamber for generating plasma.

A third object of the present invention is to provide a magnetic neutral line discharge plasma processing system that is realized without using an expensive wall material such as ceramic to reduce the cost, while it is lightweight and has a minimal number of components.

According to the present invention, the above first object is achieved by providing a discharge plasma processing system for processing an object by utilizing plasma in a vacuum chamber, said system comprising a magnetic field generating means for generating a magnetic neutral line formed by a succession of zero magnetic field positions existing continuously in the vacuum chamber and corresponding to the shape and the size of the object of processing and an electric field generating means for generating discharge plasma in a space containing the magnetic neutral line by applying a radio frequency electric field to the magnetic neutral line generated in the vacuum chamber by the magnetic field generating means at an inclined angle, the inclined angle possibly being rectangle.

Preferably, the magnetic field generating means and the electric field generating means are arranged axisymmetrically in terms of circle, polygon or ellipse.

Preferably, the magnetic field generating means is adapted to use a direct current. Alternatively, the magnetic field generating means may be adapted to use an alternating current that may be of a commercially available frequency. Still alternatively, the magnetic field generating means may be adapted to use a composite electric current formed by using a direct current and an alternating current that may be of a commercially available frequency.

Preferably, the radio frequency electric field generating means comprises a pair of electrodes arranged at the opposite sides of the generated magnetic neutral line. The paired electrodes may have a disk-shaped profile with or without a central opening or an annular profile.

Preferably, the magnetic field generating means comprises three magnetic field generating coils including an upper coil, a middle coil and a lower coil arranged coaxially at intervals and electric currents are made to flow to the respective magnetic field generating coils in such a way that the magnetic fields on the axis generated by any two adjacently located coils are inversely directed so that the size of the magnetic neutral line including the diameter thereof is regulated by controlling both the vertical position of the closed and curved magnetic neutral line formed by the upper and lower coils that may be circular and the electric current flowing through the middle coil.

The second object of the present invention is achieved by providing a discharge plasma processing system for processing an object by utilizing plasma in a vacuum chamber, the system comprising a magnetic field generating means for generating a magnetic neutral line formed by a succession of zero magnetic field positions existing continuously in the vacuum chamber and an electric field generating means for generating discharge plasma in a space containing the magnetic neutral line by applying a radio frequency electric field to the magnetic neutral line generated in the vacuum chamber, the magnetic field generating means including a cylindrical magnet having a first end operating as N pole and a second end operating as S pole, the first end and the second end being arranged along the axial line of the system, and a constant current coil arranged coaxially relative to the cylindrical magnet at the outside of the latter, the diameter of the annular magnetic neutral line formed by the cylindrical magnet and the constant current coil being adapted to be variable and defined by selecting the electric current flowing to the constant current coil.

As described in Japanese Patent No. 2705897, a three-coil system is required to accurately control a closed and curved magnetic neutral line system along with its size and its vertical position. However, the vertical position can be controlled by controlling the distance from the system to the surface of the object of processing. In other words, the vertical position can be controlled by selecting an appropriate level for the surface of the object of processing. By doing so, it is possible to replace the conventional three coil system with combination of a single magnetic field coil and a cylindrical magnet system so as to control the size of the closed and curved magnetic neutral line in order to make the entire system lightweight and comprise a reduced number of components.

In a system for achieving the second object of the present invention, the electric field generating means for generating discharge plasma in a space containing the magnetic neutral line by applying a radio frequency electric field to the magnetic neutral line generated in the vacuum chamber may be either of the inductive type or of the capacitive type.

Preferably, the magnetic field generating means and the electric field generating means are arranged axisymmetrically in terms of circle, polygon or ellipse.

Preferably, the magnetic field generating means is adapted to use a direct current. Alternatively, the magnetic field generating means may be adapted to use an alternating current that may be of a commercially available frequency. Still alternatively, the magnetic field generating means may be adapted to use a composite electric current formed by using a direct current and an alternating current that may be of a commercially available frequency.

The third object of the present invention is achieved by providing a discharge plasma processing system wherein an electric field generating means is arranged in a vacuum chamber in such a way that it applies a radio frequency electric field to a magnetic neutral line generated in the vacuum chamber by a magnetic field generating means at an inclined angle, said inclined angle possibly being rectangle.

Preferably, the electric field generating means is arranged axisymmetrically in terms of circle, polygon or ellipse identical with the surface profile of the object of processing.

Preferably, the radio frequency electric field generating means comprises a pair of electrodes arranged at the opposite sides of the generated magnetic neutral line. The paired electrodes may have a disk-shaped profile with or without a central opening or an annular profile.

In the system adapted to achieve the third object of the present invention, magnetic neutral line discharge plasma is generated in a surrounding space that contains the magnetic neutral line by applying a radio frequency electric field to the magnetic neutral line at an inclined angle which may be rectangle. Thus, with this system, a radio frequency electric field is applied not in a direction that is parallel to the generated magnetic neutral line but in a direction that sandwiches the magnetic neutral line. Therefore, in the case of a closed and curved neutral line, it is no longer necessary to wind a radio frequency coil along the closed and curved neutral line at the outside thereof. This means that, unlike an inductive field type system, this system does not require a space outside the closed and curved neutral line for arranging a radio frequency coil. In other words, spaces located above and below or left and right of the closed and curved neutral line are available for some other purposes and the system is free from a vacuum wall made of an insulating material such as ceramic that is inevitably required when applying an inductive field from, for example, outside of the vacuum container. In an embodiment where the radio frequency field generating means includes a pair of electrodes arranged above and below the magnetic neutral line, a radio frequency electric field is applied between the electrodes. Such a type of electric field application is referred to as "capacitive field type" in the specification.

Alternatively, the electric field generating means may be arranged axisymmetrically in terms of circle, polygon or ellipse identical with the surface profile of the object of processing so that a radio frequency electric field may be applied in parallel to the magnetic neutral line.

DETAILED DESCRIPTION OF THE PREFERRED EMBODIMENTS

Now, the present invention will be described in greater detail by referring to FIGS. 2 through 7 of the accompanying drawings that illustrate preferred embodiments of the present invention.

Figure 2:
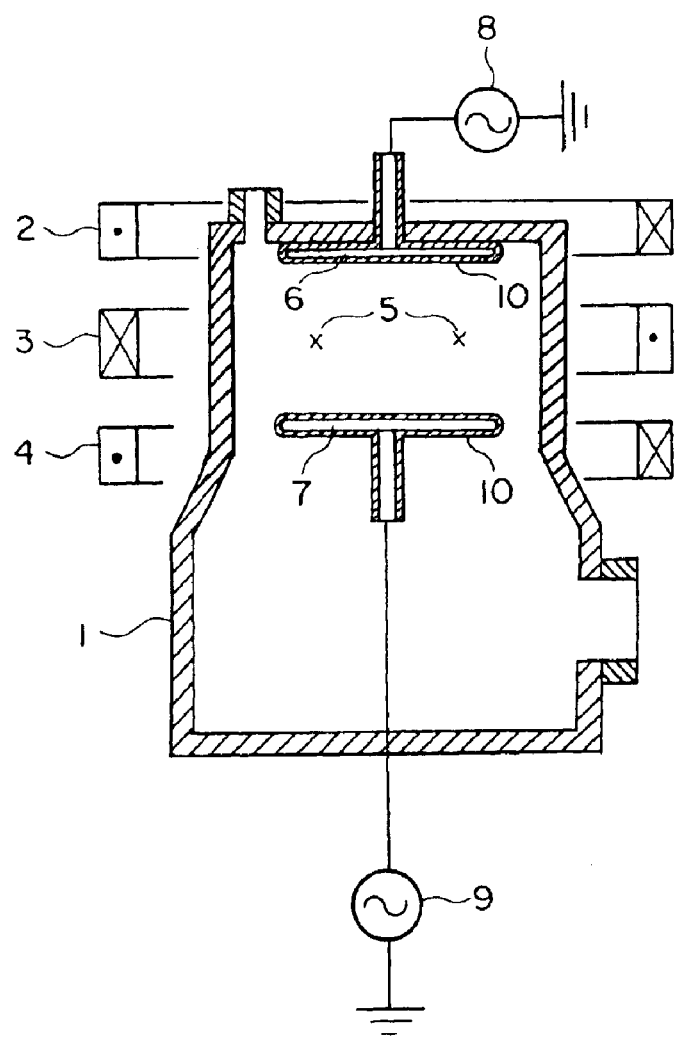
FIG. 2 is a schematic cross sectional view of an embodiment of magnetic neutral line discharge plasma processing system according to the present invention.

FIG. 2 of the accompanying drawings schematically illustrates a preferred embodiment of magnetic neutral line discharge plasma processing system according to the invention. The illustrated system comprises a vacuum chamber 1 having a circular transversal cross section, three magnetic field generating coils 2, 3, 4 adapted to generate a magnetic neutral line 5 that is formed by a succession of zero magnetic field positions existing continuously in the vacuum chamber 1, and a pair of disk-shaped (see FIG. 3) or annular (see FIG. 4) electrodes 6, 7 arranged at respective positions upper and lower relative to the circular magnetic neutral line 5 generated in the vacuum chamber 1 by the three magnetic field generating coils 2, 3, 4 and adapted to apply a radio frequency electrode field at rectangle relative to the circular magnetic neutral line 5. Note that the term "annular" as used herein represents a concept that includes circular, polygonal and elliptic.

Electric currents are made to flow respectively to the three magnetic field generating coils 2, 3, 4 in such a way that the magnetic fields on the axis generated by any two adjacently located coils are inversely directed so that the size of the magnetic neutral line 5 including the diameter thereof is regulated by controlling both the vertical position of the closed and curved magnetic neutral line formed by the upper coil 2 and the lower coil 4 that may be circular and the electric current flowing through the middle coil 3. While the three magnetic field generating coils 2, 3, 4 are adapted to generate a circular magnetic neutral line 5 in the illustrated embodiment, they are generally so adapted to generate a magnetic neutral line whose profile and size correspond to the profile and the size of the object of processing (not shown).

The pair of disk-shaped or annular electrodes 6, 7 arranged in the vacuum chamber 1 are connected to respective radio frequency power sources 8, 9 so that a radio frequency electric field is applied between the electrodes. Such a type of application of electric field is defined as "capacitive field type" in this specification. On the other hand, the above described conventional type is referred to as "inductive field type". In the case of capacitive field type, a direct breakdown can take place between the upper and lower electrodes 6, 7 to damage the system when the RF discharge contains a DC component. Therefore, according to the present invention, the electrodes 6, 7 are coated respectively with insulators 10 in order to avoid such a problem. The profile of the electrodes 6, 7 may be modified depending on the specific technique employed for processing. For instance, disk-shaped electrodes are used for CVD, while annular electrodes are selected for a processing operation that requires a third surface of the target for sputtering so that a sputtering path may be formed from the substrate to be processed.

Relating to the above description, while the electrodes 6, 7 are arranged respectively above and below the plane that includes the circular magnetic neutral line 5 generated in the vacuum chamber 1 by the three magnetic field generating coils 2, 3, 4 in the illustrated instance, they may alternatively be so arranged as to apply a radio frequency electric field at an inclined angle relative to the magnetic neutral line generated in the vacuum chamber 1 by the magnetic field generating coils 2, 3, 4 depending on the application of the system.

Figure 4:
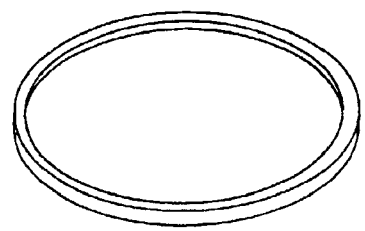
FIG. 4 is a schematic perspective view of an annular electrode that can be used for the electric field generating means of a magnetic neutral line discharge plasma processing system according to the present invention.
Figure 5:
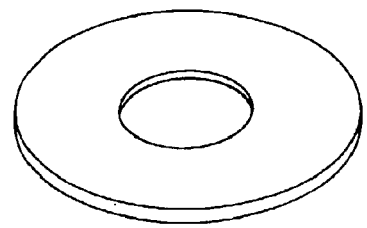
FIG. 5 is a schematic perspective view of a disk-shaped electrode having a central opening that can be used for the electric field generating means of a magnetic neutral line discharge plasma processing system according to the present invention.

While three management field generating coils are used as magnetic field generating means in the illustrated embodiment, any number of coils may be used for the purpose of the invention depending on the configuration of the discharge plasma processing system. Annular electrodes as illustrated in FIG. 4 or disk-shaped electrodes having a central opening as illustrated in FIG. 5 may be used as electric field generating means in place of disk-shaped electrodes.

Figure 6:
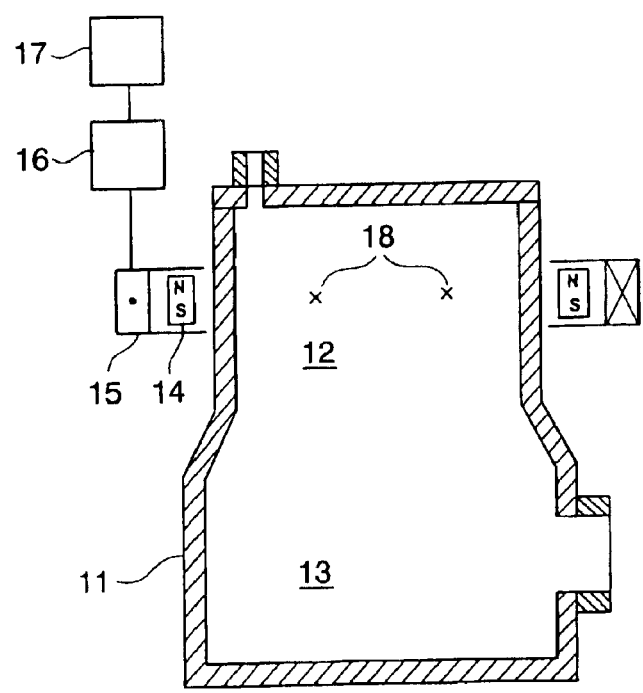
FIG. 6 is a schematic cross sectional view of another embodiment of magnetic neutral line discharge plasma processing system according to the present invention.

FIG. 6 is a schematic cross sectional view of another embodiment of magnetic neutral line discharge plasma processing system according to the present invention. Referring to FIG. 6, the illustrated system comprises a vacuum chamber 11 that includes a plasma generating section 12 and a substrate processing section 13. As shown in FIG. 6, a cylindrical magnet 14 is arranged along the axial line of the vacuum chamber in such a way that a first end thereof operates as N pole and a second end thereof operates as S pole and a constant current coil 15 is coaxially arranged outside the cylindrical magnet 14. The constant current coil 15 is connected via a current setting circuit 16 to a constant current source 17. The cylindrical magnet 14 and the constant current coil 15 are adapted to generate a magnetic neutral line 18 that is formed by a succession of zero magnetic field positions existing continuously in the plasma generating section 12 of the vacuum chamber 11. The diameter of the annular magnetic neutral line 18 formed by the cylindrical magnet 14 and the constant current coil 15 can be selected intentionally by modifying the electric current flowing to the constant current coil 15 by means of the current setting circuit 16.

Figure 1:
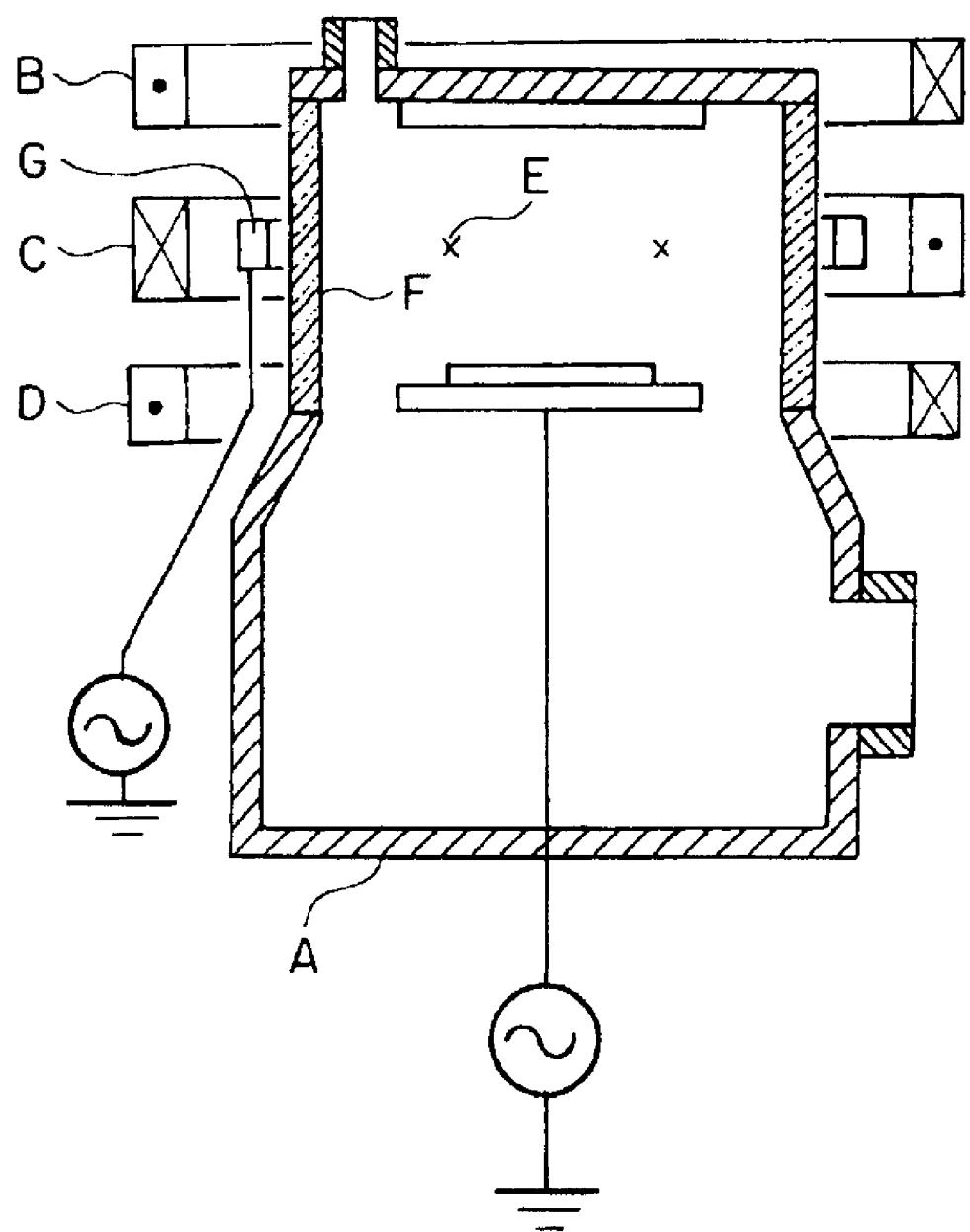
FIG. 1 is a schematic cross sectional view of a conventional inductive field type circular magnetic neutral line discharge plasma processing system.

Although not shown in FIG. 6, there is provided, as a matter of course, an another electric field generating means for generating discharge plasma in a space containing the magnetic neutral line 18 by applying a radio frequency field to the magnetic neutral line 18 generated in the plasma generating section 12 of the vacuum chamber 11. The electric field generating means may be of the inductive type as illustrated in FIG. 1. If such is the case, it may be arranged inside the cylindrical magnet 14 as radio frequency antenna coil.

Figure 7:
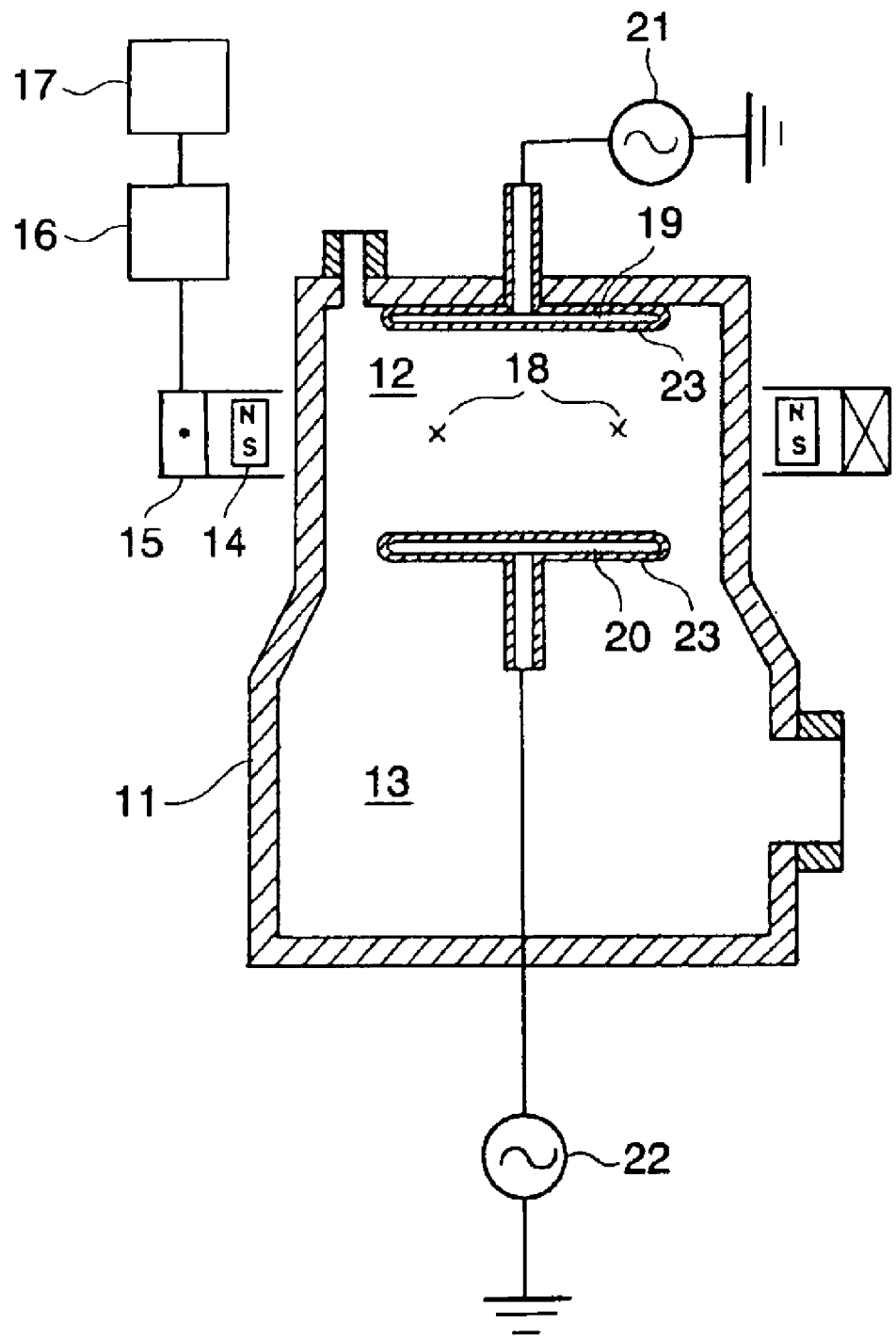
FIG. 7 is a schematic cross sectional view of still another embodiment of magnetic neutral line discharge plasma processing system according to the present invention.

FIG. 7 is a schematic cross sectional view of still another embodiment of magnetic neutral line discharge plasma processing system according to the present invention. In this instance, the electric field generating means for generating discharge plasma in a space containing the magnetic neutral line by applying a radio frequency electric field to the magnetic neutral line is of the capacitive type.

As in the case of FIG. 6, the vacuum chamber 11 has a plasma generating section 12 and a substrate processing section 13. As shown in FIG. 7, a cylindrical magnet 14 is arranged along the axial line of the vacuum chamber in such a way that a first end thereof operates as N pole and a second end thereof operates as S pole and a constant current coil 15 is coaxially arranged outside the cylindrical magnet 14. The constant current coil 15 is connected by way of a current defining circuit 16 to a constant current source 17. The cylindrical magnet 14 and the constant current coil 15 are adapted to generate a magnetic neutral line 18 that is formed by a succession of zero magnetic field positions existing continuously in the plasma generating section 12 of the vacuum chamber 11. The diameter of the annular magnetic neutral line 18 formed by the cylindrical magnet 14 and the constant current coil 15 can be selected intentionally by modifying the electric current flowing to the constant current coil 15 by means of the current defining circuit 16.

Figure 3:
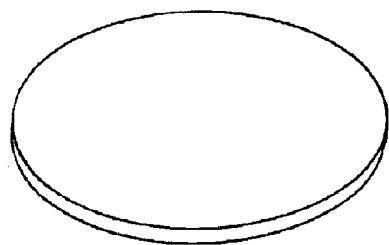
FIG. 3 is a schematic perspective view of a disk-shaped electrode that can be used for the electric field generating means of a magnetic neutral line discharge plasma processing system according to the present invention.

Paired electrodes 19, 20 are arranged above and below the magnetic neutral line 18 in the plasma generating section 2 of the vacuum chamber 11 and adapted to apply a radio frequency electric field rectangularly relative to the magnetic neutral line 18. The electrodes 19, 20 may have a disk-shaped profile as shown in FIG. 3, an annular profile as shown in FIG. 4 or a disk-shaped profile with a central opening as shown in FIG. 5 depending on the application of the system. While the electrodes 19, 20 have a circular outer contour in the illustrated examples, they may alternatively have a polygonal or elliptic outer contour depending on the application of the system.

The pair of electrodes 19, 20 arranged in the plasma generation section 12 of the vacuum chamber 11 are connected to respective radio frequency power sources 21, 22 so that a radio frequency electric field is applied between the electrodes. In the case of "capacitive field type", a direct breakdown can take place between the upper and lower electrodes 19, 20 to damage the system when the radio frequency discharge contains a DC component. Therefore, according to the present invention, the electrodes 19, 20 are coated with respective insulators 23 illustrated in FIG. 7 in order to avoid such a problem. The profile of the electrodes 19, 20 may be modified depending on the specific technique employed for processing. For instance, disk-shaped electrodes are used for CVD, while annular electrodes are selected for a processing operation that requires a third surface of the target for sputtering so that a sputtering path may be formed from the substrate to be processed.

Relating to the above description, while the electrodes 19, 20 are arranged respectively above and below the plane that includes the circular magnetic neutral line 18 generated in the plasma generating section 12 of the vacuum chamber 11 in the illustrated instance, they may alternatively be so arranged as to apply a radio frequency electric field at an inclined angle relative to the magnetic neutral line 18 depending on the application of the system.

As described above, according to the present invention, in a discharge plasma processing system for processing an object by utilizing plasma in a vacuum chamber, a magnetic field generating means is provided for generating a magnetic neutral line formed by a succession of zero magnetic field positions existing continuously in the vacuum chamber and adapted to generate a magnetic neutral line corresponding to the shape and the size of the object of processing. An electric field generating means is provided for generating discharge plasma in a space containing the magnetic neutral line by applying a radio frequency electric field to the magnetic neutral line generated in the vacuum chamber by the magnetic field generating means at an inclined angle that includes possibly rectangle. Therefore, according to the present invention, the conventional inductive field type can be changed into the capacitive field type so that it is no longer necessary to use an insulator wall of the vacuum chamber and metal such as stainless steel may alternatively be used, while maintaining the features including both time/space and space controllability relative to the size and the location of low pressure, low temperature and high density plasma to be generated. Thus, the cost of the system can be reduced remarkably. As a result, the scope of application of discharge plasma systems can be improved and broadened.

According to the present invention, in a discharge plasma processing system for processing an object by utilizing plasma in a vacuum chamber, the system comprising a magnetic field generating means for generating a magnetic neutral line formed by a succession of zero magnetic field positions existing continuously in the vacuum chamber and an electric field generating means for generating discharge plasma in a space containing the magnetic neutral line by applying a radio frequency electric field to the magnetic neutral line generated in the vacuum chamber, the magnetic field generating means includes a cylindrical magnet having a first end operating as N pole and a second end operating as S pole, the first end and said second end being arranged along the axial line of the system, and a constant current coil arranged coaxially relative to said cylindrical magnet at the outside of the latter. With this arrangement, the system is lightweight and has a minimal number of components so that it can be assembled and serviced with ease.

Additionally, when an electric field generating means for generating discharge plasma in a space containing the magnetic neutral line by applying a radio frequency electric field to the magnetic neutral line is arranged in the vacuum chamber in such a way that the radio frequency electric field is applied at an inclined angle that may be rectangle relative to the magnetic neutral line generated in the vacuum chamber by the magnetic field generating means, it is no longer necessary to wind a radio frequency coil along the closed and curved neutral line at the outside thereof. This means that it is no longer necessary to use an insulator wall in the vacuum chamber and metal such as stainless steel may alternatively be used. Thus, the cost of the system can be reduced remarkably. As a result, the scope of application of discharge plasma systems can be improved and broadened.

What is claimed is:

1. A discharge plasma processing system for processing an object by utilizing plasma in a vacuum chamber, comprising:
a magnetic field generating means for generating a magnetic neutral line formed by a succession of zero magnetic field positions existing continuously in the vacuum chamber and corresponding to the shape and the size of the object of processing; and
an electric field generating means for applying a radio frequency electric field to a space containing the magnetic neutral line so that a discharge plasma is generated,
said electric field generating means comprising paired electrodes which are arranged in said vacuum chamber with the space containing the magnetic neutral line therebetween.

2. The system according to claim 1, wherein said magnetic field generating means and said electric field generating means are arranged axisymmetrically in terms of a circle, polygon or ellipse.

3. The system according to claim 1, wherein said magnetic field generating means is adapted to use a direct current.

4. The system according to claim 1, wherein said magnetic field generating means is adapted to use an alternating current that includes a commercially available frequency.

5. The system according to claim 1, wherein said magnetic field generating means is adapted to use a composite electric current formed by using a direct current and an alternating current that includes a commercially available frequency.

6. The system according to claim 1, wherein at least one of said paired electrodes has a disk-shaped profile.

7. The system according to claim 1, wherein at least one of said paired electrodes has a disk-shaped profile with a central opening.

8. The system according to claim 1, wherein said paired electrodes have an annular profile.

9. The system according to claim 1, wherein said magnetic field generating means comprises three magnetic field generating coils including an upper coil, a middle coil and a lower coil arranged coaxially at intervals and electric currents are made to flow to the respective magnetic field generating coils in such a way that the magnetic fields on the axis generated by any two adjacently located coils are inversely directed so that the size of the magnetic neutral line including the diameter thereof is regulated by controlling both the vertical position of the closed and curved magnetic neutral line formed by the upper and lower coils that may be circular and the electric current flowing through the middle coil.

10. A discharge plasma processing system for processing an object by utilizing plasma in a vacuum chamber, said system comprising a magnetic field generating means for generating a magnetic neutral line formed by a succession of zero magnetic field positions existing continuously in the vacuum chamber and an electric field generating means for generating discharge plasma in a space containing the magnetic neutral line by applying a radio frequency electric field to the magnetic neutral line generated in the vacuum chamber, wherein said magnetic field generating means includes a cylindrical magnet having a first end operating as N pole and a second end operating as S pole, said first end and said second end being arranged along the axial line of the system, and a constant current coil arranged coaxially relative to said cylindrical magnet at the outside of the latter, the diameter of the annual magnetic neutral line formed by said cylindrical magnet and said constant current coil being adapted to be variable and defined by selecting the electric current flowing to the constant current coil.

11. The system according to claim 10, wherein said magnetic field generating means and said electric field generating means are arranged axisymmetrically in terms of a circle, polygon or ellipse.

12. The system according to claim 10, wherein said magnetic field generating means is adapted to use a direct current.

13. The system according to claim 10, wherein said magnetic field generating means is adapted to use an alternating current that may be of a commercially available frequency.

14. The system according to claim 10, wherein said magnetic field generating means is adapted to use a composite electric current formed by using a direct current and an alternating current that may be of a commercially available frequency.

15. The system according to claim 10, wherein said electric field generating means is arranged axisymmetrically in terms of a circle, polygon or ellipse identical with the surface profile of the object of processing so that a radio frequency electric field is applied in parallel to the magnetic neutral line.

16. The system according to claim 10, wherein said electric field generating means is arranged in the vacuum chamber for applying a radio frequency electric field to a space containing the magnetic neutral line so as to generate a discharge plasma, and comprises paired electrodes which are located in said vacuum chamber with the space containing the magnetic neutral line therebetween.

17. The system according to claim 16, wherein said electric field generating means is arranged axisymmetrically in terms of a circle, polygon or ellipse identical with the surface profile of the object of processing.

18. The system according to claim 16, wherein at least one of said paired electrodes has a disk-shaped profile.

19. The system according to claim 16, wherein at least one of said paired electrodes has a disk-shaped profile with a central opening.

20. The system according to claim 16, wherein said paid electrodes have an annular profile.

21. A discharge plasma processing system for processing an object by utilizing plasma in a vacuum chamber, said vacuum chamber including side walls and a top wall and said system comprising:
a magnetic field generating means for generating a magnetic neutral line formed by a succession of zero magnetic field positions existing continuously in the vacuum chamber and corresponding to the shape and the size of the object of processing; and
an electric field generating means for applying a radio frequency electric field to a space containing the magnetic neutral line so that a discharge plasma is generated,
said electric field generating means comprising a first electrode arranged in said vacuum chamber adjacent said top wall and a second electrode arranged in said vacuum chamber in vertically spaced relation to said first electrode such that the space containing the magnetic neutral line is located between said electrodes.

* * * * *